United States Patent
Tzoufras et al.

(10) Patent No.: US 11,586,906 B2
(45) Date of Patent: Feb. 21, 2023

(54) SYSTEM AND METHOD FOR TRAINING ARTIFICIAL NEURAL NETWORKS

(71) Applicant: Integrated Silicon Solution, (Cayman) Inc., Grand Cayman (KY)

(72) Inventors: Michail Tzoufras, Sunnyvale, CA (US); Marcin Gajek, Berkeley, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 1101 days.

(21) Appl. No.: 16/223,058

(22) Filed: Dec. 17, 2018

(65) Prior Publication Data

US 2020/0193283 A1    Jun. 18, 2020

(51) Int. Cl.
*G06N 3/08* (2006.01)
*G06N 3/10* (2006.01)
*G11C 11/16* (2006.01)
*G06N 3/04* (2006.01)

(52) U.S. Cl.
CPC ............ *G06N 3/08* (2013.01); *G06N 3/04* (2013.01); *G06N 3/10* (2013.01); *G11C 11/1673* (2013.01); *G11C 11/1675* (2013.01)

(58) Field of Classification Search
CPC .. G06N 3/08; G06N 3/04; G06N 3/10; G06N 3/063; G11C 11/1673; G11C 11/1675; G11C 11/16; G11C 11/54
See application file for complete search history.

(56) References Cited

U.S. PATENT DOCUMENTS

2020/0241840 A1* 7/2020 Ikegami .............. G11C 11/1657

OTHER PUBLICATIONS

Wang et al.,"Approximate On-chip Memory Optimization Method for Deep Residual Networks",Nov. 21, 2018, 2018 IEEE 23rd International Conference on Digital Signal Processing (DSP),pp. 1-5.(Year:2018) (Year: 2018).*
Xu et al.,"STT-MRAM Design Technology Co-optimization for Hardware Neural Networks", Dec. 5, 2018, 2018 IEEE International Electron Devices Meeting (IEDM), pp. 1-4. (Year: 2018) (Year: 2018).*
Spin Memory, Inc., PCT/US2019/066847, International Search Report, Written Opinion, dated Apr. 15, 2020, 13 pgs.
Imani, CANNA: Neural Network Acceleration Using Configurable Approximation on GPGPU, 2018 IEEE, 8 pgs.

(Continued)

*Primary Examiner* — Ajay Ojha

(57) ABSTRACT

A computing device receives first data on which to train an artificial neural network (ANN). Using magnetic random access memory (MRAM), the computing device trains the ANN by performing a first set of training iterations on the first data. Each of the first set of iterations includes writing values for a set of weights of the ANN to the MRAM using first write parameters corresponding to a first write error rate. After performing the first set of iterations, the computing device performs a second set of training iterations on the first data. Each of the second set of iterations includes writing values for the set of weights of the ANN to the MRAM using second write parameters corresponding to a second write error rate. The second write error rate is lower than the first write error rate. The computing device stores values for the trained ANN.

20 Claims, 9 Drawing Sheets

(56) References Cited

OTHER PUBLICATIONS

Venkataramani, Approximate Computing and the Quest for Computing Efficiency, School of Electrical and Computer Engineering, Purdue University, Jun. 7-11, 2015, 6 pgs.

Locatelli, Use of Magnetoresistive Random-Access Memory as Approximate Memory for Training Neural Networks, 2018 25th IEEE International Conference on Electronics, Circuits and Systems (ICECS), Dec. 9, 2018, 4 pgs.

* cited by examiner

SYSTEM AND METHOD FOR TRAINING ARTIFICIAL NEURAL NETWORKS

RELATED APPLICATIONS

This application is related to U.S. patent application Ser. No. 16/223,055 entitled "System and Method for Training Artificial Neural Networks," filed Dec. 17, 2018, which is hereby incorporated by reference in its entirety.

TECHNICAL FIELD

This relates generally to the field of memory applications, including but not limited to training artificial neural networks using magnetic memory.

BACKGROUND

Modern artificial neural networks (ANNs) train on massive amounts of data to optimize their internal parameters—e.g., their weights and biases—before they can be deployed. The optimization process (i.e., training) involves a large number of iterations (i.e., epochs) through the training data. The training requires a large amount of energy usage due to a large amount of data transfer (of training data) to and from the chip and energy leakage of the on-chip memory. A related issue is the large footprint of SRAM, which limits the available on-chip memory thereby increasing the need for data transfers.

SUMMARY

To reduce the cost of the training process, some embodiments of the present disclosure train an ANN, at least partially, using error-prone memory. The error-prone memory requires less energy than error-free memory and has a potentially smaller on-chip area footprint. In general, using an error-prone memory for part of an ANN training process does not affect the efficacy of the training process, and in fact can provide a beneficial degree of stochasticity for an initial "high-entropy" phase of the ANN training process (e.g., search of the ANN parameter space). Such ANN include but are not limited to fully connected networks (FNN) and convolutional neural networks (CNN)

(A1) To that end, in some implementations, a method performed at a computing device is provided. The computing device includes one or more processors, a first random access memory (RAM) comprising magnetic random access memory (MRAM), a second random access memory of a type distinct from MRAM, and a non-transitory computer-readable storage medium storing instructions for execution by the one or more processors. In some embodiments, the non-transitory computer-readable storage medium includes instructions for executing the method. The method includes receiving first data on which to train an artificial neural network (ANN). The method includes training the ANN by, using the first RAM comprising the MRAM, performing a first set of training iterations to train the ANN using the first data and, after performing the first set of training iterations, using the second RAM of the type distinct from MRAM, performing a second set of training iterations to train the ANN using the first data. The method further includes storing values for the trained ANN, wherein the trained ANN is configured to classify second data based on the stored values.

(A2) In some implementations of (A1), each of the first set of training iterations includes: reading values for a set of weights of the ANN from the first RAM comprising the MRAM; using the one or more processors, performing a set of arithmetic operations to update the values for the set of weights of the ANN; and writing the updated set of weights of the ANN to the first RAM comprising the MRAM.

(A3) In some implementations of (A2), each of the first set of training iterations includes reading values for a set of biases of the ANN from the first RAM comprising the MRAM; using the one or more processors, performing a set of arithmetic operations to update the values for the set of biases of the ANN; and writing the updated set of biases of the ANN to the first RAM comprising the MRAM.

(A4) In some implementations of (A3), each of the second set of training iterations includes reading values for the set of weights and/or biases of the ANN from the second RAM of the type distinct from MRAM, using the one or more processors, performing the set of arithmetic operations to update the values for the set of weights and/or biases of the ANN; and writing the updated set of weights and/or biases of the ANN to the second RAM of the type distinct from the MRAM.

(A5) In some embodiments of any of (A3)-(A4), each of the second set of training iterations includes: reading values for the set of activations of the ANN from the second RAM of the type distinct from MRAM; using the one or more processors, performing the set of arithmetic operations to update the values for the set of activations of the ANN; and writing the updated set of activations of the ANN to the second RAM of the type distinct from the MRAM.

(A6) In some implementations of any of (A1)-(A5), the first RAM comprising the MRAM is on the same chip as the one or more processors.

(A7) In some implementations of any of (A1)-(A6), the first RAM is operated, during the first set of training iterations, as error-prone memory.

(A8) In some implementations of any of (A1)-(A7), the stored values of the trained ANN comprise stored weights. The method further comprises, during the first set of training iterations, performing error detection that includes detecting an error in a respective weight stored in the first RAM, and replacing a value stored in the respective weight with a zero value prior to using the respective weight.

(A9) In some implementations of any of (A7)-(A8), the first RAM has a bit error-rate below a threshold for convergence of the first set of training iterations.

(A10) In some implementations of (A9), the threshold for convergence is greater than: $10^{-3}$, $10^{-5}$, or $10^{-7}$.

(A11) In some implementations of any of (A9)-(A10), the bit error rate is greater than: $10^{-4}$, $10^{-6}$, or $10^{-8}$.

(A12) In some implementations of any (A1)-(A11), the second RAM comprises static RAM (SRAM).

(A13) In some implementations of any of (A1)-(A12), the first set of training iterations includes more than 20%, 40%, 60%, 80%, or 95% of a total number of training iterations used for training the ANN.

(A14) In some implementations of any of (A1)-(A13), the method further comprises, after training the ANN, receiving second data and assigning scores to the second data using the stored values of the trained ANN.

In some implementations, an electronic system is provided. The electronic system comprises one or more processors, a first random access memory (RAM) comprising magnetic random access memory (MRAM), a second random access memory of a type distinct from MRAM, and a non-transitory computer-readable storage medium storing instructions executable by the one or more processors. The instructions include instructions for training an artificial neural network (ANN) using first data by performing a first set of training iterations using the first RAM comprising MRAM, training the ANN using the first data by performing a second set of training iterations using the second RAM comprising a type distinct from MRAM, and storing values for the trained ANN, wherein the trained ANN is configured to classify second data based on the stored values.

In some implementations, the electronic system includes a chip.

In some implementations, the electronic system is configured to perform any of the methods (A1)-(A14) described above.

(B1) Further, in some implementations, a method performed at a computing device that includes one or more processors, magnetic random access memory (MRAM), and a non-transitory computer-readable storage medium storing instructions. In some embodiments, the non-transitory computer-readable storage medium includes instructions for executing the method. The method includes receiving first data on which to train an artificial neural network (ANN). The method further includes, using the MRAM, training the ANN by performing a first set of training iterations on the first data. Each of the first set of iterations includes writing values for a set of weights of the ANN to the MRAM using first write parameters corresponding to a first write error rate. Training the ANN further includes, after performing the first set of iterations, performing a second set of training iterations on the first data. Each of the second set of iterations includes writing values for the set of weights of the ANN to the MRAM using second write parameters corresponding to a second write error rate. The second write error rate is lower than the first write error rate. The method further includes storing values for the trained ANN, wherein the trained ANN is configured to classify second data based on the stored values.

(B2) In some implementations of (B1), each of the first set of iterations includes writing values for a set of biases and a set of activations of the ANN and each of the second set of iterations includes writing values for the set of biases and the set of activations of the ANN.

(B3) In some implementations of any of (B1)-(B2), the first write parameters include a first write pulse duration and the second write parameters include a second write pulse duration that is longer than the first write pulse duration.

(B4) In some implementations of any of (B1)-(B3), the first write parameters include a first write current and the second write parameters include a second write current that is greater than the first write current.

(B5) In some implementations of any of (B1)-(B4), writing the values for the set of weights of the ANN to the MRAM using the write parameters corresponding to the first write error rate includes writing the values without using an error-correcting code, and writing the values for the set of weights of the ANN to the MRAM using the second write parameters corresponding to the second write error rate includes writing the values using an error-correcting code.

(B6) In some implementations of any of (B1)-(B5), each of the first set of training iterations includes reading the values for the set of weights of the ANN from the MRAM and, using the one or more processors, performing a set of arithmetic operations to update the values for the set of weights of the ANN. The values for the set of weights of the ANN written to the MRAM for the iteration are the updated set of weights.

(B7) In some implementations of (B6), each of the second set of training iterations includes reading the values for the set of weights of the ANN from the MRAM, and, using the one or more processors, performing the set of arithmetic operations to update the values for the set of weights of the ANN. The values for the set of weights of the ANN written to the MRAM for the iteration are the updated set of weights.

(B8) In some implementations of any of (B1)-(B7), the MRAM is on the same chip as the one or more processors.

(B9) In some implementations of any of (B1)-(B8), the method further includes, during the first set of training iterations, performing error detection that includes detecting an error in a respective weight stored in the MRAM and replacing a value stored for the respective weight with a zero value prior to using the respective weight.

(B10) In some implementations of any of (B1)-(B9), the first write parameters correspond to a bit error-rate below a threshold for convergence of the first set of training iterations.

(B11) In some implementations of (B10), the bit error rate threshold for convergence is greater than: $10^{-3}$, $10^{-5}$, or $10^{-7}$.

(B12) In some implementations of any of (B1)-(B11), the first write error rate is greater than: $10^{-4}$, $10^{-6}$, or $10^{-8}$.

(B13) In some implementations of any of (B1)-(B12), the first set of training iterations includes more than 20%, 40%, 60%, 80%, or 95% of a total number of training iterations used for training the ANN.

(B14) In some implementations of any of (B1)-(B13), each of the first set of iterations includes reading values for the set of weights of the ANN to the MRAM using first read parameters corresponding to a first read error rate and each of the second set of iterations includes reading values for the set of weights of the ANN to the MRAM using second read parameters corresponding to a second read error rate. The second read error rate is lower than the first read error rate.

(B15) In some implementations of (B14), the first read parameters include a first read pulse duration and the second read parameters include a second read pulse duration that is longer than the first read pulse duration.

(B16) In some implementations of any of (B1)-(B15), the first read parameters include a first read current and the second read parameters include a second read current that is greater than the first read current.

(B17) In some implementations of any of (B1)-(B16), the method further includes, after training the ANN, receiving second data and assigning scores to the second data using the stored values of the trained ANN.

In some implementations, a system having one or more processors, magnetic random access memory (MRAM), write circuitry configured to write data to the MRAM, and a non-transitory computer-readable storage medium is provided. The non-transitory computer-readable storage medium stores instructions for execution by the one or more processors, including instructions for receiving first data on which to train an artificial neural network (ANN). The instructions further include instructions for, using the MRAM, training the ANN by performing a first set of training iterations on the first data. Each of the first set of iterations includes writing, using the write circuitry, values for a set of weights of the ANN to the MRAM using first write parameters corresponding to a first write error rate. The instructions include instructions for, after performing the first set of iterations, performing a second set of training iterations on the first data. Each of the second set of iterations includes writing, using the write circuitry, values for the set of weights of the ANN to the MRAM using second write parameters corresponding to a second write error rate. The second write error rate is lower than the first write error rate. The instructions further include instructions for storing values for the trained ANN. The trained ANN is configured to classify second data based on the stored values.

In some implementations, the electronic system includes a chip.

In some implementations the electronic system is configured to any of the methods (B1)-(B17) described above.

Although ANNs are used as a specific example of a training process that may benefit from the methods and devices described herein, it should be noted that any resource-intensive optimization process (e.g., statistical process) may also benefit from the methods and device described herein. Thus, some embodiments of the present disclosure apply not only to ANNs, but to any sort of optimization (e.g., statistical) process. Some embodiments of the present disclosure apply to a machine learning process. Such machine learning processes may include supervised learning (e.g., classification, regression), clustering (e.g., latent Dirichlet allocation), dimensionality reduction, structured prediction, anomaly detection, and reinforcement learning. Thus, training a machine learning process may include training a model for any of the above applications.

For example, in some embodiments a method performed at a computing device is provided. The computing device includes one or more processors, a first random access memory (RAM) comprising magnetic random access memory (MRAM), a second random access memory of a type distinct from MRAM, and a non-transitory computer-readable storage medium storing instructions for execution by the one or more processors. The method includes receiving first data on which to train a machine learning process. The method includes training the machine learning process by, using the first RAM comprising the MRAM, performing a first set of training iterations to train the machine learning process using the first data and, after performing the first set of training iterations, using the second RAM of the type distinct from MRAM, performing a second set of training iterations to train the machine learning process using the first data. The method further includes storing values for the machine learning process based on the training. The values for the machine learning process are used to re-configure a machine (e.g., cause a machine to operate differently than before the machine was re-configured using the values).

As another example, in some implementations, a method performed at a computing device that includes one or more processors, magnetic random access memory (MRAM), and a non-transitory computer-readable storage medium storing instructions for execution by the one or more processors is provided. The instructions include instructions for receiving first data on which to train a machine learning process. The instructions further include instructions for, using the MRAM, training the machine learning process by performing a first set of training iterations on the first data. Each of the first set of iterations includes writing values for the machine learning process to the MRAM using first write parameters corresponding to a first write error rate. Training the machine learning process further includes, after performing the first set of iterations, performing a second set of training iterations on the first data. Each of the second set of iterations includes writing values for the machine learning process to the MRAM using second write parameters corresponding to a second write error rate. The second write error rate is lower than the first write error rate. The instructions further include instructions for storing values for the machine learning process. The values for the machine learning process are used to re-configure a machine (e.g., cause a machine to operate differently than before the machine was re-configured using the values).

Thus, devices and systems are provided with methods for training optimization processes (e.g., machine learning processes, ANN training, etc.) increasing the effectiveness, efficiency, and user satisfaction with such systems and devices.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

Like reference numerals refer to corresponding parts throughout the several views of the drawings.

DETAILED DESCRIPTION

Figure 1:
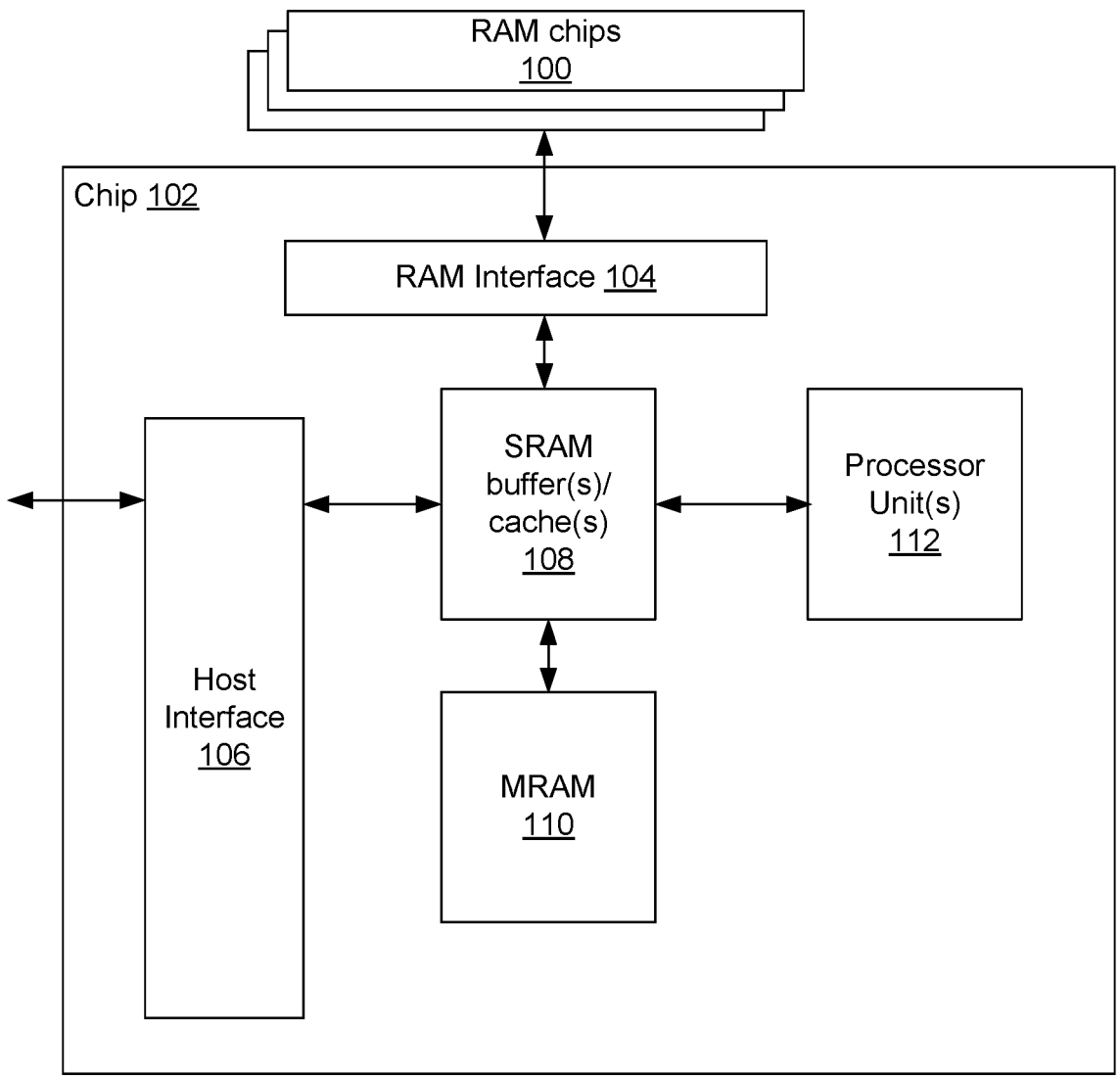
FIG. 1 illustrates a schematic diagram of a chip structure in accordance with some implementations.

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

A fully connected artificial neural network can be represented mathematically as the following:

$$A_1 = f_1(W_1 X + b_1) \tag{1a}$$

$$A_i = f_i(W_i A_{i-1} + b_i) \tag{1b}$$

$$O = f_n(W_n A_{n-1} + b_n) \tag{1c}$$

In Equations (1a)-(1c) above, $A_i$ represents the activations, $W_i$ represents the weights, $b_i$ represents the biases. The variable X represents the input data. The parameter n represents the number of layers in the neural network. The last layer of activations, O, is referred to as the outputs. During training, the outputs are compared to known results to determine a loss function. The functions f are activation functions, usually a simple non-linear function such as ReLU: $f(x)=\max(0,x)$.

An ANN training process aims to optimize certain network parameters (e.g., weights and biases) through an iterative process. The total number of parameters often exceeds $10^6$ and can reach $10^9$. Finding a global minimum in such a multidimensional space is a huge challenge. In some implementations, the process starts by initializing the network parameters with random values. Throughout the iterative process, the network parameters are adjusted to reduce an error metric for the $10^x$-dimensional landscape (e.g., ideally find a global minimum of the error metric). The starting point is usually far from the minimum and there is a danger that the iterative process may get trapped in a local minimum. Thus, it is often beneficial to start the iterative process with a high-entropy search, in which each early iteration adjusts the network parameters in large steps to an overview of the error landscape. Toward the end of the process, when the network is close to the desired solution, small careful steps are taken to find the minimum.

Thus, a high degree of accuracy is unnecessary for the bulk of the training process. On the contrary, a degree of stochasticity can be helpful to better explore the error landscape. Further, if high accuracy comes at the cost of on-chip area and energy, it may be better to use hardware that places less emphasis on accuracy but focuses on energy cost, area, and/or speed.

Thus, in accordance with some embodiments, the ANN training process is split into two parts: a first set of iterations and a second set of iterations. For the first set of iterations, some implementations replace highly-accurate memory in an ANN training process with an error-prone memory. As long as the errors are not so frequent as to prevent convergence during the first set of iterations of the training, the detriment to the efficacy is small and often worth the gains in energy cost, chip area, and speed. This is especially true when the errors are detectable and can be constrained.

The first set of iterations may comprise most iterations (e.g., epochs), from the beginning of training until almost the end (e.g., until the last 10 epochs). During these iterations, an error-prone energy-efficient memory is used, such as MRAM or a combination of MRAM and small SRAM buffers. During this first phase, when data is stored in or loaded from external memory, errors can take place at some rate that is not too high, e.g., 0.01%-50%. In some embodiments, when an erroneous number is detected, it is either replaced with a zero value or its value is constrained in order to not overwhelm the rest of the data. The resulting information contains a small number of constrained errors, e.g. 0.01%-50% erroneous zeros. The training of the ANN continues as usual despite these errors.

For the final iterations, (e.g., the last 10 epochs) an error-free memory is used. This can be SRAM, or it can be MRAM with an error correcting algorithm, a combination of the last two, or some other type of memory. This error-free memory enables the process to hone in on a minimum of the loss function for the network parameters (e.g., a global minimum, or at least a local minimum).

It should also be noted that MRAM can be used as error-prone memory or an essentially-error-free memory depending on read/write times (e.g., durations of electrical pulses used to read/write the MRAM). Thus, when using MRAM for at least the first part of the ANN training process, the MRAM can be operated with faster read/write times (e.g., as compared to error-free MRAM) because the error rates associated with short read/write times do not affect the result.

Furthermore, in some implementations, MRAM is used for all of the iterations to train the ANN, but the read and/or write speed is reduced during the final stages of the calculation. This makes read and write operations less prone to errors as the minimum is approached.

FIG. 1 illustrates a schematic diagram of an electronic system that includes a chip 102. The system includes a first type of RAM (e.g., error-prone MRAM) and a second type of RAM (e.g., error-free RAM, which may comprise one or more external (e.g., off-chip) devices, such as RAM chips 100). For example, RAM chips 100 comprise DRAM or another form of memory (e.g., that is distinct from magnetic RAM). In some implementations, the chip 102 includes a RAM interface 104 (e.g., a DDR3 interface) that facilitates communication between the chip 102 and the external RAM chips 100. The chip 102 includes SRAM buffer(s)/cache(s) 108 for buffering data to be used by processors 112 during an ANN training process. For example, SRAM buffer(s)/cache(s) 108 buffers data stored off-chip (e.g., in external RAM 100) and/or data stored in MRAM 110 (e.g., error-prone memory). For example, during a first set of iterations of an ANN training process, data used to train the ANN is stored in MRAM 110 (e.g., all of the data needed to perform a first set of iterations of an ANN training process is stored in MRAM 110). Data is cached from MRAM 110 as needed by SRAM buffer(s)/cache(s) 108 so that it is available to the processor 112 (e.g., an arithmetic logic unit (ALU)), which performs the calculations necessary to train the ANN. In some implementations, the data includes values, such as weights, activations, and biases, of the ANN. In some implementations the data includes intermediate values (e.g., during the training of the ANN).

During a second set of iterations of the ANN training process, data used to train the ANN is stored in RAM chips 100. The data is bussed on and off the chip 102 through RAM interface 104. Data is cached from RAM chips 100 as needed by SRAM buffer(s)/cache(s) 108 so that it is available to the processor 112. In some implementations, the second set of iterations produces final values of the ANN parameters (e.g., values of weight and biases after the ANN has been fully trained), which are exported to a host computer via host interface 106.

In some implementations, processing unit(s) 112 executes instructions for training an ANN (e.g., instructions for performing the process 400). In some implementations, the instructions executable by the one or more processor unit(s) 112 are stored in a non-transitory computer-readable storage medium. In some implementations, the instructions are stored on chip 102. In some implementations, the instructions are stored off-chip (e.g., in RAM chips 100). In some implementations, chip 102 includes two distinct types of memory, including MRAM 110 and a second type of memory distinct from MRAM. For example, while RAM chips 100 are illustrated as separate from chip 102, it is to be understood that in some implementations, the data stored on RAM chips 100 is stored on chip 102.

Although not shown, in some embodiments, the first RAM for the first set of iterations (e.g., MRAM 110) and the second RAM, distinct from the first RAM, for the second set of iterations, reside on the chip 102. In some embodiments, the one or more processors (e.g., processor unit(s) 112) reside on the chip. In some embodiments, a non-transitory computer readable storage medium storing instructions for training the ANN resides on the chip 102. In some embodiments, the non-transitory computer-readable storage medium is loaded (e.g., written) with the instructions (e.g., from a host computer) when the chip 102 is powered-up. In some embodiments, the non-transitory computer-readable storage medium comprises a portion of first RAM or second RAM. In some embodiments, as described below, after training the ANN, chip 102 is used to classify untrained second data. After receiving the second data, the off-chip memory (e.g., RAM chips 100) stores some or all of the second data.

Figure 2:
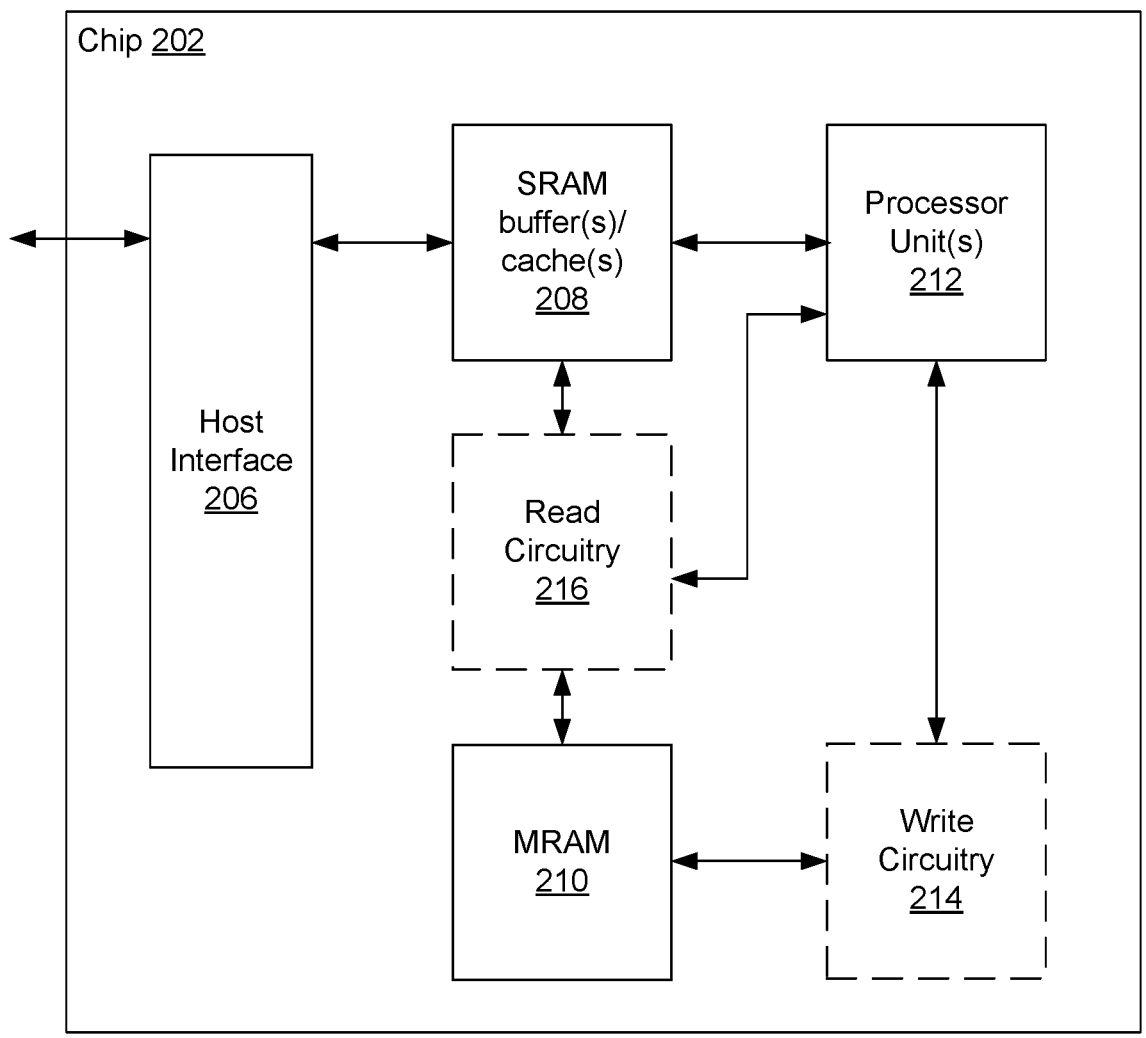
FIG. 2 illustrates a schematic diagram of a chip structure in accordance with some implementations.

FIG. 2 illustrates a schematic diagram of a computing device (e.g., chip 202). Unlike the system in FIG. 1, in which a first set of ANN training iterations was performed using a first RAM and a second set of ANN training iterations was performed using a second RAM distinct from the first RAM, FIG. 2 illustrates a computing device in which both the first set of ANN training iterations and the second set of ANN training iterations are performed by the same RAM (e.g., MRAM 210). However, during the first set of ANN training iterations, the first RAM is operated in an error-prone mode, whereas in the second set of ANN training operations, the first RAM is operated in an error-free mode.

To that end, in some implementations, the chip 202 includes a host interface 206 (e.g., a PCIe interface), SRAM buffer(s)/cache(s) 208, MRAM 210, and processor unit(s) 212. In some implementations, the MRAM 210 is communicatively coupled with write circuitry 214 for writing data (e.g., ANN weights calculated during training iterations for the ANN) to the MRAM and read circuitry 216 for reading data (e.g., values for the ANN weights) from the MRAM. In some embodiments, the write circuitry includes word lines and bit lines (e.g., wires) and sets of corresponding transistors (e.g., for activating the word lines and bit lines). In some embodiments, the write circuitry includes or is coupled with memory storing the first write parameters and second write parameters. In some embodiments, the read circuitry is configured to modify read parameters for reading values from the MRAM. In some embodiments, the write circuitry is configured to modify write parameters for writing values to the MRAM.

It should be noted that, in some embodiments, chip 102 also includes similar write circuitry and read circuitry, but for simplicity, those features are not shown in FIG. 1.

In some implementations, the chip 202 includes a non-transitory computer-readable storage medium storing instructions for receiving first data on which to train an artificial neural network (ANN). The instructions further include instructions for, using the MRAM 210, training the ANN by performing a first set of training iterations on the first data. Each of the first set of iterations includes writing, using the write circuitry, values for a set of weights of the ANN to the MRAM using first write parameters corresponding to a first write error rate. The instructions include instructions for, after performing the first set of iterations, performing a second set of training iterations on the first data. Each of the second set of iterations includes writing, using the write circuitry, values for the set of weights of the ANN to the MRAM using second write parameters corresponding to a second write error rate. The second write error rate is lower than the first write error rate. The instructions further include instructions for storing values for the trained ANN. The trained ANN is configured to classify second data based on the stored values.

Thus, chip 202 trains the ANN using MRAM (e.g., for all of the iterations) and reads/writes parameters during the first set of iterations for training the ANN with a high read/write error rates, and reads/writes parameters during the second set of iterations using a lower read/write error rate than the read/write error rate for the first set of iterations.

In some implementations, chip 202 includes any or all of the modules of chip 102, as described with reference to FIG. 1.

Figure 3A:
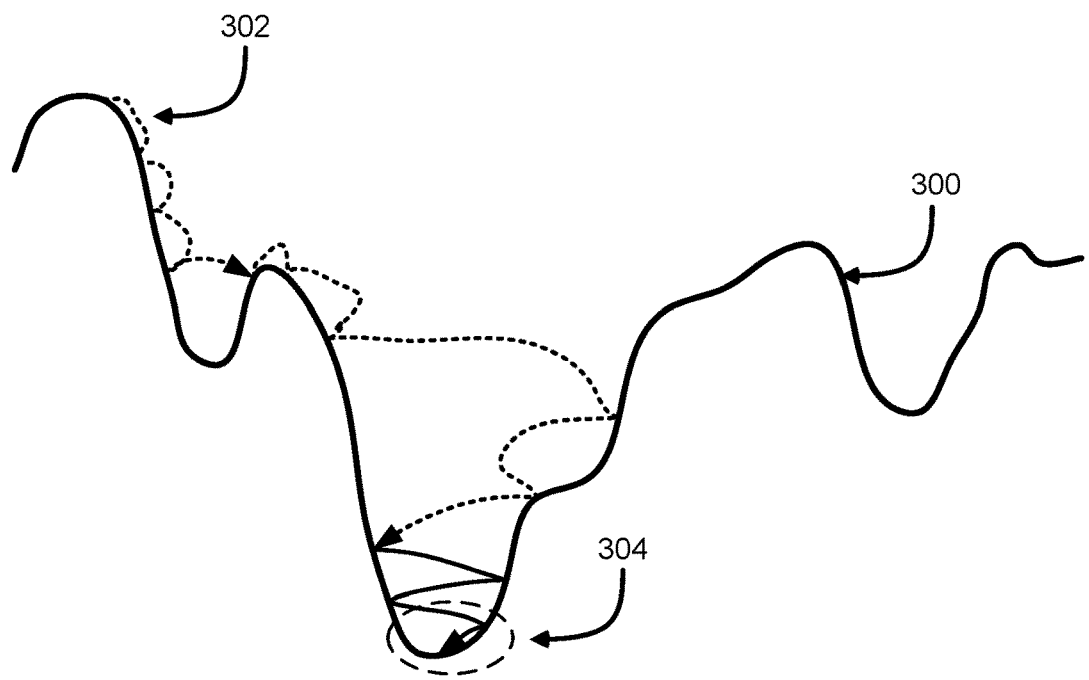
FIG. 3A illustrates a graph of a loss function in accordance with some implementations.

FIG. 3A illustrates a graph of an loss function 300 of an ANN. Loss function 300 is shown for conceptual purposes, namely to illustrate the fact that high accuracy memory is not needed for the initial part of an ANN training process. For that reason, the graph of the loss function 300 is simplified to show error as a function of a single parameter. It should be noted, however, that the total number of parameters often exceeds $10^6$ and can reach $10^9$.

As illustrated in the figure, there are two sets of iterations, a first set of iterations (e.g., represented by dashed lines) are performed on error-prone memory (e.g., MRAM). The first set of training iterations begins with iteration 302. As the process comes closer to identifying a minimum of the loss function 300, a second set of iterations 304 (e.g., represented by solid lines, performed after the first set of iterations are performed) are performed on error-free memory such as SRAM, DRAM, or MRAM with error correction. In some embodiments, the first set of training iterations includes more than 20%, 40%, 60%, 80%, or 95% of a total number of training iterations used for training the ANN. Thus, a majority of the training of the ANN is performed on dense, fast, energy efficient memory (e.g., MRAM), despite the memory being less accurate. As illustrated, the second set of training iterations 304 are performed as the training iterations converge to a minimum of the loss function 300. As the training iterations are performed, a set of weights, biases and/or activations are updated.

Figure 3B:
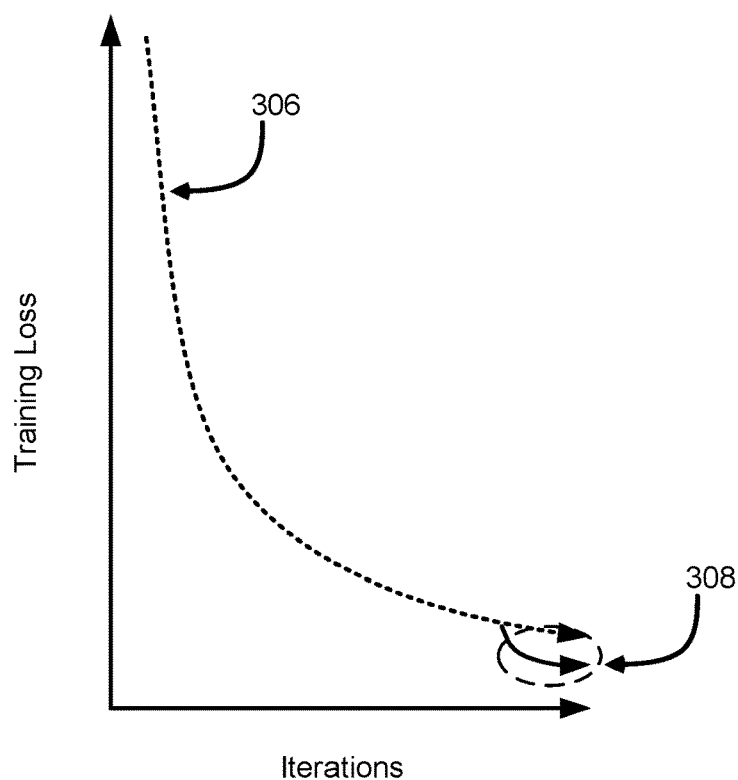
FIG. 3B illustrates a graph of training loss for a plurality of iterations in accordance with some implementations.

FIG. 3B illustrates a graph of the training loss of the first set of iterations (e.g., training loss represented by dashed line 306) and the second set of iterations (e.g., training loss represented by solid line 308). As illustrated in FIG. 3B, the errors from the first set of iterations (e.g., performed using the MRAM) are not too large and the ANN is still able to be trained (e.g., to calculate and store weights to be applied to untrained data). As explained above, the first set of iterations are performed on MRAM (e.g., or a combination of MRAM and SRAM), and the second set of iterations are performed on SRAM (e.g., or a combination of SRAM and DRAM). During the first set of iterations, when data is stored in or loaded from the memory (e.g., external memory), errors can take place at some rate that is not too high, e.g., 0.01%-50%. Then, error detection and masking can be performed such that when an erroneous number is detected, it is either replaced (e.g., masked) with a zero value or its value is constrained in order not to overwhelm the rest of the data. The resulting information contains a small number of constrained errors, e.g., 0.01%-50% erroneous zeros. The training continues as usual despite these errors.

Figure 4A:
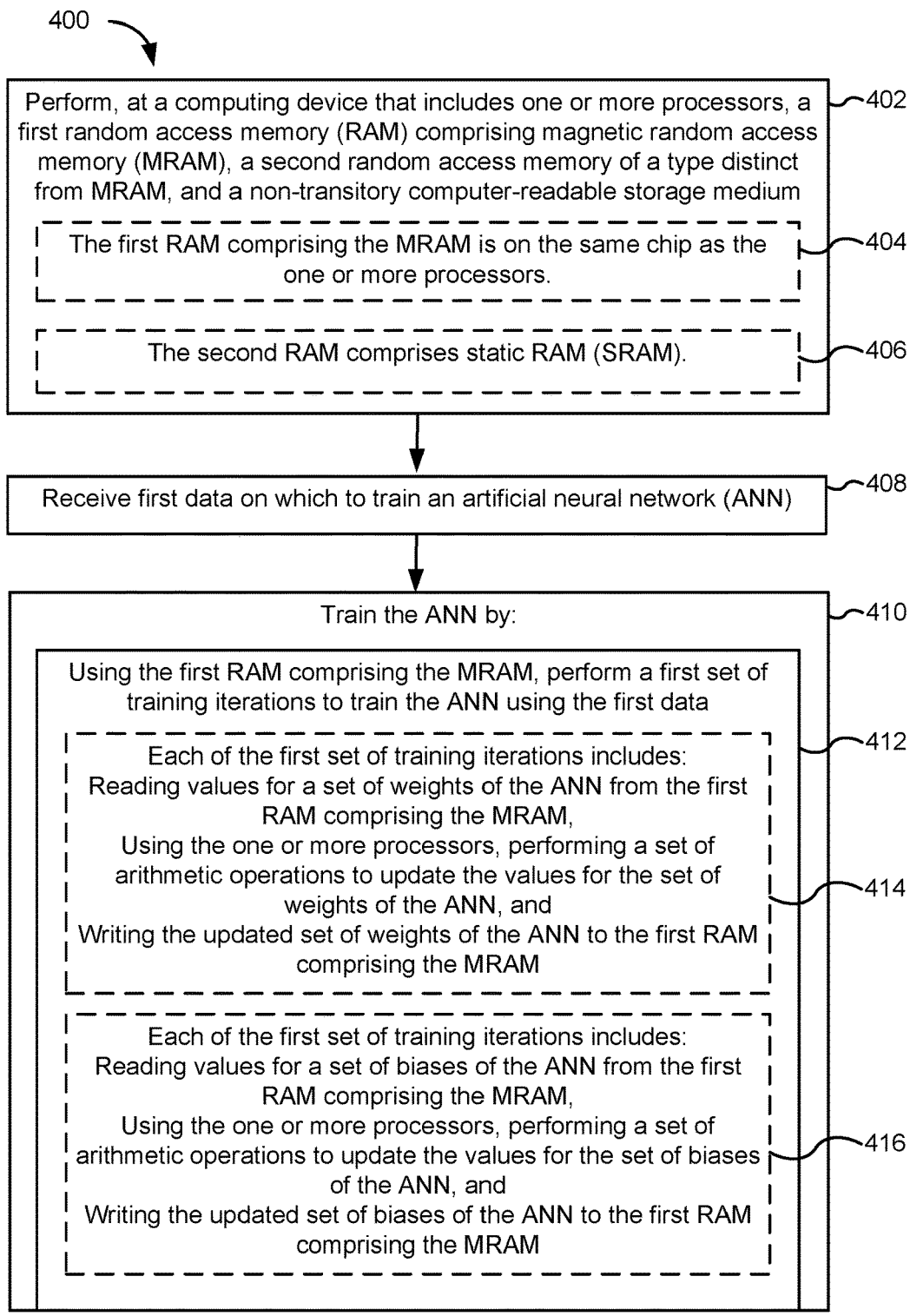
FIGS. 4A-4B illustrate a method for training an artificial neural network in accordance with some implementations.
Figure 4B:
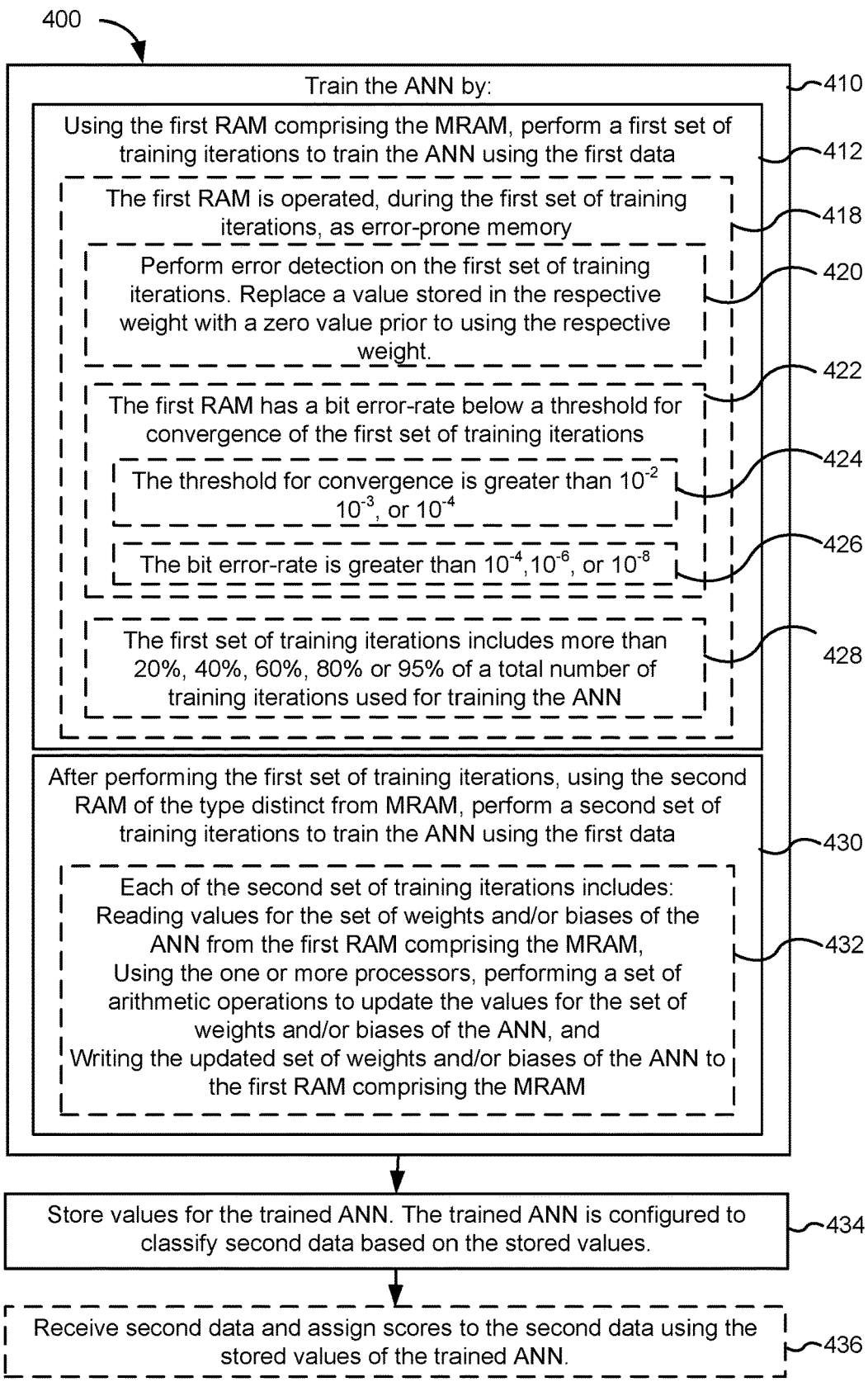

FIGS. 4A-4B illustrate a method 400 for training an artificial neural network in accordance with some implementations. Method 400 is performed at a computing device (402) (e.g., the computing device shown in FIG. 1) that includes one or more processors (e.g., processor unit(s) 112), a first random access memory (RAM) comprising magnetic random access memory (MRAM) (e.g., MRAM 110), a second random access memory of a type distinct from MRAM (e.g., RAM chips 100), and a non-transitory computer-readable storage medium having instructions for execution by the one or more processors.

In some implementations, the first RAM comprising the MRAM is (404) on the same chip as the one or more processors (e.g., as shown in FIG. 1). For example, MRAM allows for an increase in on-chip memory data and thus reduces the need for data movement on and off the chip. Data movement requires a lot of energy, and thus using MRAM in method 400, as described herein, is more efficient than conventional ANN training methods using conventional types of memory. In some implementations, the second RAM of the type distinct from MRAM is on the same chip as the first RAM comprising the MRAM. In some implementations, the first RAM comprising MRAM is on a first chip that includes one or more first processors, and the second RAM distinct from MRAM is on one or more second chips (e.g., RAM chips 100), distinct from the first chip, that includes one or more second processors, distinct from the one or more first processors.

In some implementations, the second RAM comprises (406) static RAM (SRAM). In some implementations, the second RAM comprises dynamic RAM (DRAM). In some embodiments, the second RAM comprises high-bandwidth memory (HBM).

Method 400 includes receiving (408) first data on which to train an artificial neural network (ANN). In some embodiments, the first data is stored in a database (e.g., stored on-chip or off-chip). In some implementations, the first data is received in response to an instruction from a host (e.g., via host interface 106).

The method further includes training (410) the ANN by, using the first RAM comprising the MRAM, performing (412) a first set of training iterations (e.g., epochs) to train the ANN using the first data. In some implementations, the first set of training iterations includes (at least) the first half of a total number of training iterations. In some implementations, the first set of training iterations includes all of the training iterations except for a last N iterations, where N is an integer. For example, the first set of training iterations includes all of the training iterations except for the last 10 iterations (e.g., N=10).

In some implementations, each of the first set of training iterations includes (414) reading values for a set of weights of the ANN from the first RAM comprising the MRAM and, using the one or more processors, performing a set of arithmetic operations to update the values for the set of weights of the ANN. The computing device writes the updated set of weights of the ANN to the first RAM comprising the MRAM. In some implementations, the updated values of the set of weights written to the first RAM comprise intermediate values (e.g., not final values to be applied to untrained data). For example, the updated values written during the first set of training iterations are intermediate values because the final values are determined after performing the second set of training iterations. In some implementations, each of the first set of training iterations includes (416) reading values for a set of biases (and/or activations) of the ANN from the first RAM comprising the MRAM, and, using the one or more processors, performing a set of arithmetic operations to update the values for the set of biases (and/or activations) of the ANN. The computing device writes the updated set of biases (and/or activations) of the ANN to the first RAM comprising the MRAM.

In some embodiments, the MRAM comprises magnetic tunnel junctions (MTJs). In some embodiments, the MRAM comprises a spin-transfer torque (STT) memory. Data stored in the MRAM are encoded with using a relative orientation of two or more magnetic layers (e.g., a free layer and a reference data) in a bit. The value of the bit (e.g., the value of the data stored in the bit) can be determined based on the bit's resistance, which changes based on the relative orientation of the magnetizations because of the magnetoresistance effect (e.g., an anti-parallel arrangement of the respective magnetizations of free layer and the fixed layer has a different resistance than a parallel arrangement of the same).

In some embodiments, an MRAM bit is written by applying a current pulse (e.g., a write pulse having an amplitude and temporal length) to the MRAM bit, to switch the bit under the action of spin-transfer torque. The MRAM bit is read by applying a smaller pulse (e.g., a read pulse having a smaller amplitude and/or shorter temporal length) to the bit to determine its resistance. For some MRAMs (e.g., MTJs), there is an upper bound and a lower bound to the pulse amplitude and length. For example, when reading the bit, the voltage (and thus current) of the read pulse should be high enough and applied for long enough to allow the MTJ state to be determined (e.g., to allow the bit's resistance to be determined by a sense amplifier) but the voltage should not be so high, or the read pulse so long, that the data is disturbed (e.g., through the action of STT). When writing the bit, the voltage should be high enough and applied for long enough so that the information is correctly and reliably written, but no so high or for so long that the write pulse would stress or break the MTJ.

Thus, in various circumstances, there are the following types of error when reading and writing data to MRAM:

(a1) Write error: write errors occur when the write pulse voltage amplitude is not high enough (or the write pulse not long enough) to write the data to the MRAM. Depending on the voltage pulse and the characteristics of the MRAM, a probability of writing correctly can be determined.

(a2) Breakdown errors: breakdown errors occur when the write voltage amplitude for writing is so high (or the write pulse so long) that the MRAM bit is damaged due to breakdown of the tunnel oxide barrier.

(b) Retention error: retention errors occur when the MRAM does not retain (e.g., loses) the data that has been written to it. Depending on the characteristics of the MRAM and the idle time, the probability that the data is retained correctly can be determined.

(c1) Read error: read error occur when the applied voltage amplitude is not high enough (or the read pulse is not long enough) to detect the resistance state of the MRAM bit. These errors arise due to the sense amplifier, not the MRAM.

(c2) Read disturb error: read disturb errors occur when the read voltage is so high (or the read pulse is so long) that it disturbs the state of the MRAM bit (e.g., effectively writes the MRAM bit) while attempting to read it. The read disturb probability can be calculated from the read pulse and the MRAM characteristics. In some embodiments, read errors are preferable to read disturb errors. Thus, the read operations described herein are performed using read parameters that limit the number of read disturb errors (e.g., a read voltage and/or pulse length is below a respective threshold for causing read disturb errors, even at the cost of a greater number of read errors). One conventional way to mitigate the types of errors described above is to use an error-correcting code (ECC). Error-correcting code is costly, not only in terms of memory capacity but also because ECC slows down the process of reading memory. In contrast, in some implementations of the present method, the first RAM is operated (418), during the first set of training iterations, as error-prone memory. For example, the computing device does not perform error-correction (or performs minimal error-correction) to the MRAM during the first set of training iterations.

In some implementations, the stored values of the trained ANN comprise stored weights and the method further comprises, during the first set of training iterations, performing (420) error detection that includes detecting an error in a respective weight (or an activation or bias) stored in the first RAM. A value for a weight may be incorrect (e.g., erroneous) because (I) the stored value for the weight is wrong (e.g., a write error, a retention error, or a read disturb error); or (II) the stored value for the weight is correct but it was read incorrectly). In some embodiments, when an error for the respective weight is detected, a zero value is used in its place for the iteration (e.g., an iteration starts with an attempt to read the set of weights, errors are detected in the weights, and the calculation for the iteration is performed with the zero values replacing the errors). In addition, in some circumstances (e.g., when the stored value for the weight is wrong), the computing device replaces a value stored in the respective weight with a zero value prior to using the respective weight (e.g., in forward or back propagation). In some embodiments, the method includes, determining if the erroneous value was read correctly (e.g., determining whether the value was stored incorrectly or read incorrectly). In some embodiments, the replacing of the value stored in the respective weight with the zero value is performed in accordance with a determination that the erroneous value was read correctly, In some circumstances, detecting and masking errors with zero values significantly relaxes the requirements for convergence (e.g., the first set of training iterations can tolerate a much higher bit error rate and still converge). Errors can occur with respect to stored biases, activations, and possibly other network parameters, in addition to stored weights. The above discussion of errors applies generally to any network parameters.

In some implementations, the first RAM has (422) a bit error-rate below a threshold for convergence of the first set of training iterations. For example, in some implementations, the bit error-rate can be configured for the first RAM. For example, in some embodiments, the bit error rate of MRAM depends on a write pulse duration and/or a write pulse length, and the write pulse duration and/or write pulse length are selected (e.g., from a calibration curve) to operate the first RAM with a bit error rate below the threshold for convergence during the first set of training operations.

In some implementations, the threshold for convergence is greater than (424): $10^{-3}$, $10^{-5}$, $10^{-7}$ (e.g., in terms of a bit error rate). In some embodiments, the method is performed without error detection and masking, and the threshold for convergence is greater than $10^{-2}$, $10^{-3}$, $10^{-4}$. In some implementations, the bit error rate is greater than (426): $10^{-4}$, $10^{-6}$, $10^{-8}$.

In some implementations, the first set of training iterations includes (428) more than 20%, 40%, 60%, 80%, or 95% of a total number of training iterations used for training the ANN.

The method includes, after performing the first set of training iterations, using the second RAM of the type distinct from MRAM, performing (430) a second set of training iterations to train the ANN using the first data. In some implementations, the second set of training iterations include all of the remaining iterations that are not included in the first set of training iterations. For example, the total training iterations for training the ANN comprise the first set of training iterations and the second set of training iterations.

In some implementations, each of the second set of training iterations includes (432) reading values for the set of weights and/or biases (e.g., the intermediate values stored during the first set of training iterations) of the ANN from the second RAM of the type distinct from MRAM, and, using the one or more processors, performing the set of arithmetic operations to update the values for the set of weights and/or biases of the ANN. Each of the second set of training iterations further includes writing the updated set of weights and/or biases of the ANN to the second RAM of the type distinct from the MRAM. In some implementations, the updated values for the set of weights and/or biases written during the second set of training iterations comprise intermediate values. In some implementations, at the end of the second set of training iterations (e.g., during the final training iteration), the updated values for the set of weights and/or biases (and/or activations) of the ANN comprise final values, wherein the final values are stored such that the computing device can apply the final stored values to received second data (e.g., unclassified second data) in order to classify the second data. In some implementations, the intermediate stored values are stored in MRAM (e.g., on the chip) and the final stored values are stored in non-volatile off-chip memory. In some implementations, all immediate stored values are stored in (e.g., available from) MRAM and there is no need to bus data on and/or off chip. In some implementations, only a sub-portion of the intermediate stored values are stored in MRAM.

The method further includes storing (434) values (e.g., weights and/or biases) for the trained ANN, wherein the trained ANN is configured to classify second data based on the stored values (e.g., classifying the second data by assigning classification scores).

In some implementations, after training the ANN, the computing device receives (436) second data (e.g., untrained data); and assigns scores to the second data using the stored values of the trained ANN. In some implementations, after assigning scores (e.g., classifying) the second data using the stored (final) values of the trained ANN, the computing device provides the assigned scores to a host device (e.g., via host interface 106).

In some implementations, an electronic system (e.g., system shown in FIG. 1) is provided. The electronic system includes one or more processors, a first random access memory (RAM) comprising magnetic random access memory (MRAM), a second random access memory of a type distinct from MRAM and a non-transitory computer-readable storage medium storing instructions executable by the one or more processors. The instructions include instructions for training an artificial neural network (ANN) using first data by performing a first set of training iterations using the first RAM comprising MRAM, training the ANN using the first data by performing a second set of training iterations using the second RAM comprising a type distinct from MRAM, and storing values for the trained ANN. The trained ANN is configured to classify second data based on the stored values.

In some implementations, the electronic system includes a chip (e.g., chip 102). In some embodiments, the first RAM (e.g., MRAM 110) and the second RAM (e.g., at least a portion of the second RAM stored in SRAM buffer(s)/cache(s) 108) reside on the chip 102. In some embodiments, the one or more processors (e.g., processor unit(s) 112) reside on the chip. In some embodiments, the one or more processors comprise an arithmetic logic unit (ALU). In some embodiments, a non-transitory computer readable storage medium resides on the chip. In some embodiments, the non-transitory computer-readable storage medium is loaded (e.g., written) with the instructions when the chip is powered-up. In some embodiments, the non-transitory computer-readable storage medium comprises a portion of first RAM or second RAM. In some embodiments, the electronic system includes an off-chip memory (e.g., DRAM, HBM, RAM chips 100) that holds some or all of the first data during the first set of training iterations and/or the second set of training iterations (e.g., the first data is bussed on and off the chip as needed during the first and second sets of iterations). Likewise, in some embodiments, after receiving the second data, the off-chip memory stores some or all of the second data (e.g., while the scores are being assigned to the second data). In some embodiments, an off-chip memory (e.g., a non-volatile memory) stores the instructions when the chip is powered off. In some embodiments, the chip includes a buffer (e.g., SRAM buffer(s)/cache(s) 108) that is communicatively coupled with the off-chip memory. In some embodiments, the buffer comprises a portion of the first RAM or the second RAM. In some implementations, the electronic system is configured to perform any of the operations of method 400.

Figure 5A:
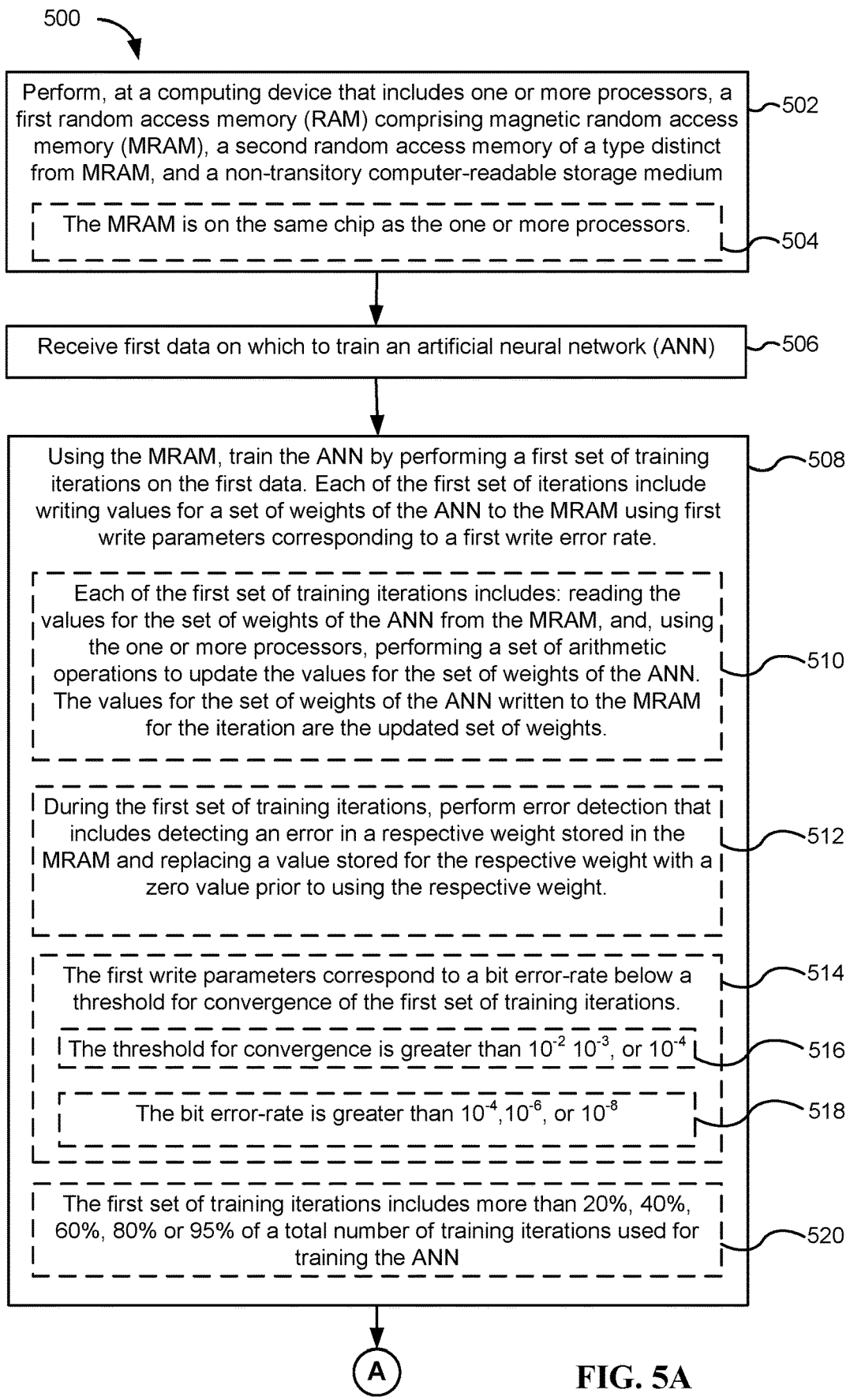
FIGS. 5A-5C illustrate a method for training an artificial neural network in accordance with some implementations.
Figure 5B:
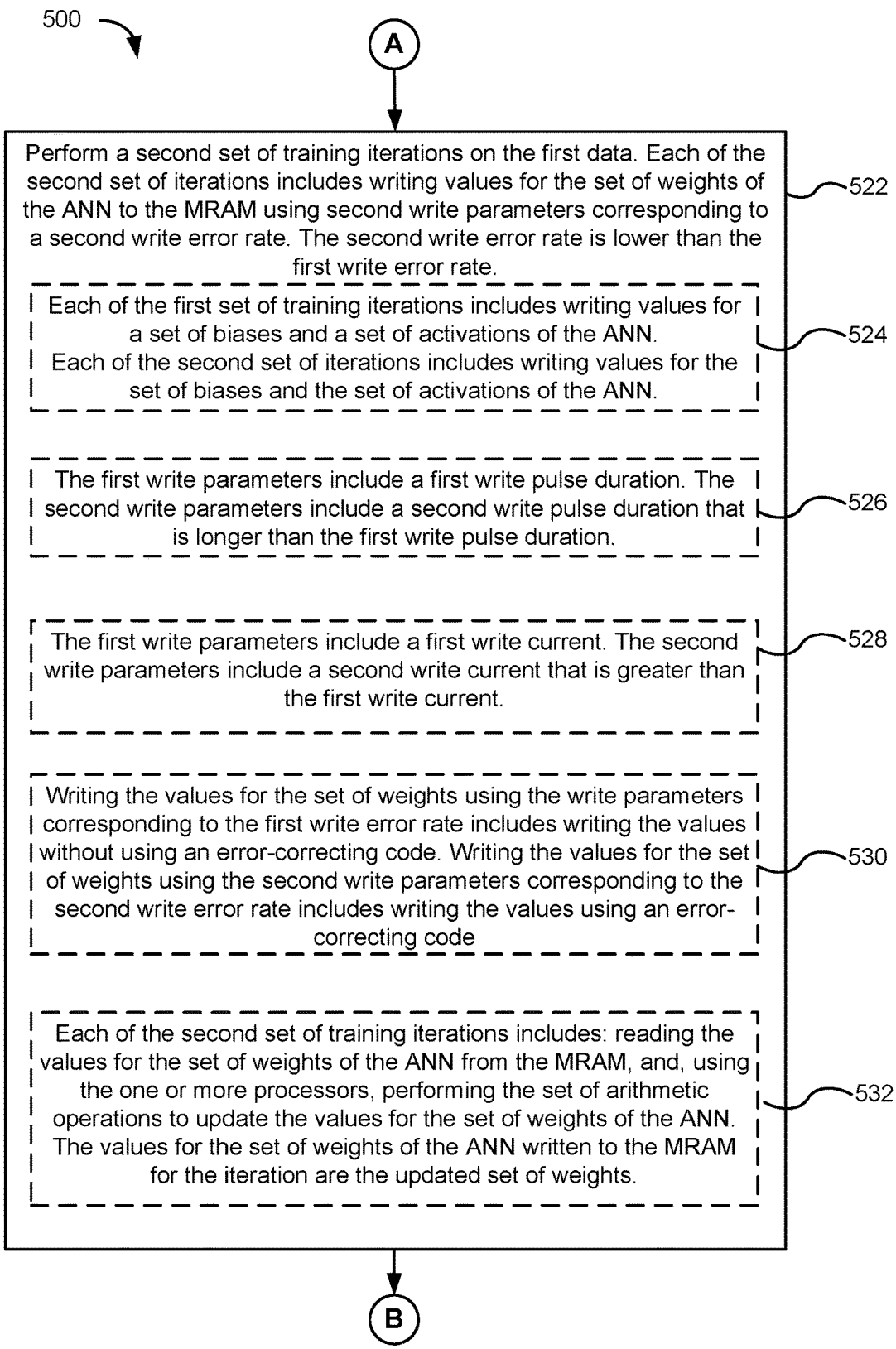
Figure 5C:
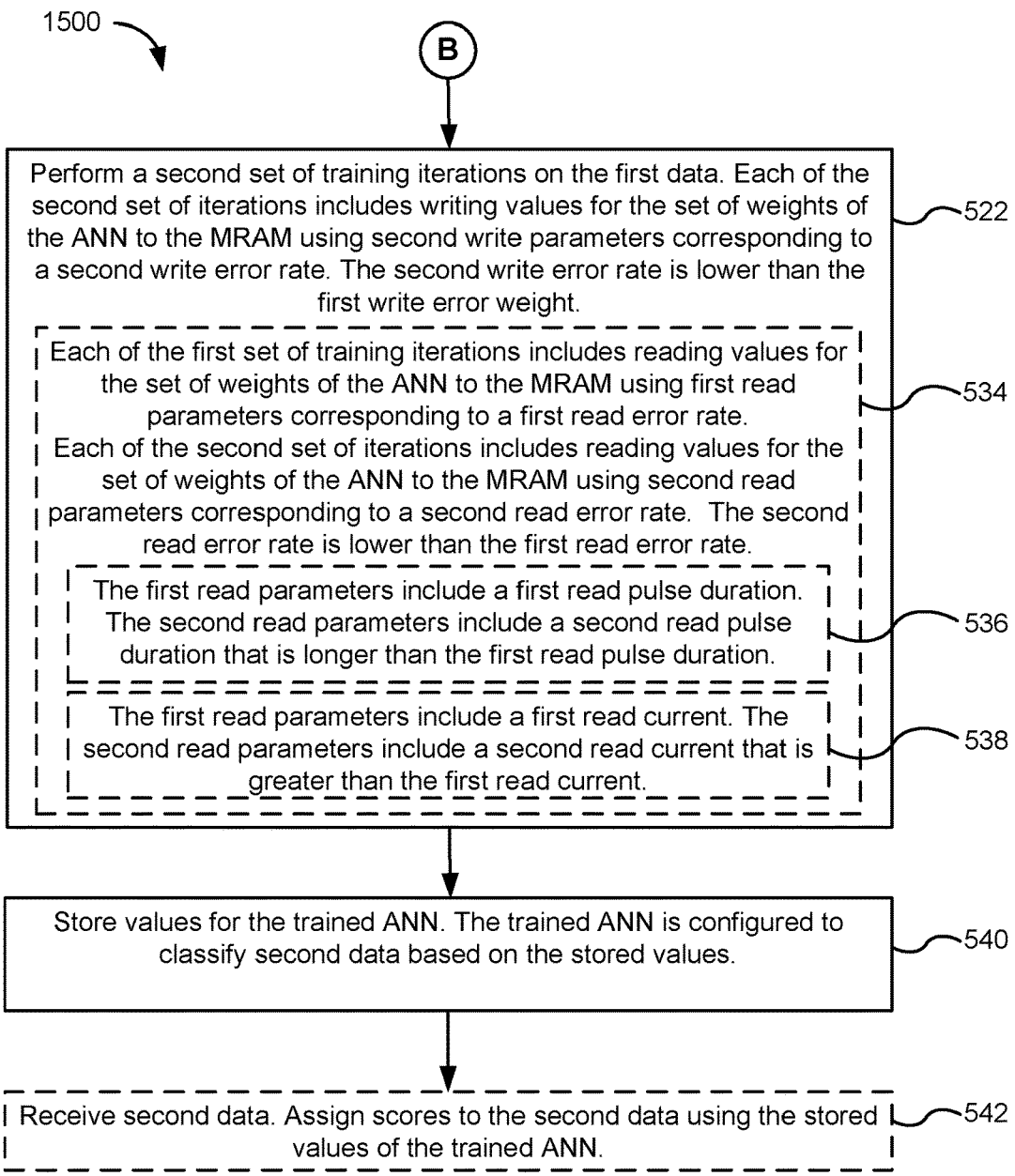

FIGS. 5A-5B illustrate a method 500 for training an artificial neural network.

The method 500 is performed (502) at a computing device (e.g., chip 202 as shown in FIG. 2) that includes one or more processors, magnetic random access memory (MRAM), and a non-transitory computer-readable storage medium storing instructions for execution by the one or more processors. In some implementations, the MRAM is (504) on the same chip as the one or more processors.

The method includes receiving (506) first data on which to train an artificial neural network (ANN). Using the MRAM, the computing device trains (508) the ANN by performing a first set of training iterations on the first data. Each of the first set of iterations includes writing values for a set of weights of the ANN to the MRAM using first write parameters corresponding to a first write error rate. Various types of errors are discussed above with reference to method 400 (FIGS. 4A-4B). For brevity, those details are not repeated here. The error rates described herein can refer to, in accordance with various embodiments, a specific error rate (e.g., an error rate for a specific type of error) or a net-error rate (e.g., a rate based on the combination of errors because (I) the stored value for the weight is wrong (e.g., a write error, a retention error, or a read disturb error); and (II) the stored value for the weight is correct but it was read incorrectly).

In some implementations, each of the first set of training iterations includes (510) reading the values for the set of weights of the ANN from the MRAM and, using the one or more processors, performing a set of arithmetic operations to update the values for the set of weights of the ANN. The values for the set of weights of the ANN written to the MRAM for the iteration are the updated set of weights.

In some implementations, during the first set of training iterations, the computing device performs (512) error detection that includes detecting an error in a respective weight (or an activation or bias) stored in the MRAM and replaces a value stored for the respective weight with a zero value prior to using the respective weight (e.g., in forward or back propagation). In some circumstances, detecting and masking errors with zero values significantly relaxes the requirements for convergence (e.g., the first set of training iterations can tolerate a much higher bit error rate and still converge).

In some implementations, the first write parameters correspond to (514) a bit error-rate below a threshold for convergence of the first set of training iterations (e.g., generate errors during a read process at a bit error rate that is below the threshold for convergence). In some embodiments, the bit error rate can be configured for the first RAM. For example, in some embodiments, the bit error rate of MRAM depends on a write pulse duration and/or a write pulse length, and the write pulse duration and/or write pulse length are selected (e.g., from a calibration curve) to operate the first RAM with a bit error rate below the threshold for convergence during the first set of training operations.

In some implementations, the threshold for convergence is (516) greater than: $10^{-3}$, $10^{-5}$, or $10^{-7}$. In some embodiments, the method is performed without error detection and masking, and the threshold for convergence is greater than $10^{-2}$, $10^{-3}$, or $10^{-4}$.

In some implementations, the first write error rate is (518) greater than: $10^{-4}$, $10^{-6}$, or $10^{-8}$.

In some implementations, the first set of training iterations includes (520) more than 20%, 40%, 60%, 80%, or 95% of a total number of training iterations used for training the ANN.

After performing the first set of iterations, the computing device performs (522) a second set of training iterations on the first data. Each of the second set of iterations includes writing values for the set of weights of the ANN to the MRAM using second write parameters corresponding to a second write error rate (e.g., generate errors during a read process at a bit error rate that is below the threshold for convergence). The second write error rate is lower than the first write error rate.

In some embodiments, the write error rate is gradually reduced. To that end, in some embodiments, there are more than two sets of iterations, including a third set of iterations. Each of the third set of iterations includes writing values for the set of weights of the ANN to the MRAM using third write parameters corresponding to a third write error rate. The third write error rate is lower than the first write error rate and the second error rate. In some embodiments, each set of iterations includes a single iteration. In some embodiments, each set of iterations includes a plurality of iterations.

In some implementations, each of the first set of iterations includes (524) writing values for a set of biases and a set of activations of the ANN and each of the second set of iterations includes writing values for the set of biases and the set of activations of the ANN.

In some implementations, the first write parameters include (526) a first write pulse duration, and the second write parameters include a second write pulse duration that is longer than the first write pulse duration.

In some implementations, the first write parameters include (528) a first write current, and the second write parameters include a second write current that is greater than the first write current.

In some implementations, writing the values for the set of weights of the ANN to the MRAM using the write parameters corresponding to the first write error rate includes (530) writing the values without using an error-correcting code, and writing the values for the set of weights of the ANN to the MRAM using the second write parameters corresponding to the second write error rate includes writing the values using an error-correcting code. In some embodiments, the first set of iterations includes error detection and masking, as described above, but not error correction.

In some implementations, each of the second set of training iterations includes (532) reading the values for the set of weights of the ANN from the MRAM and, using the one or more processors, performing the set of arithmetic operations to update the values for the set of weights of the ANN. The values for the set of weights of the ANN written to the MRAM for the iteration are the updated set of weights.

In some implementations, each of the first set of iterations includes (534) reading values for the set of weights of the ANN to the MRAM using first read parameters corresponding to a first read error rate and each of the second set of iterations includes reading values for the set of weights of the ANN to the MRAM using second read parameters corresponding to a second read error rate. The second read error rate is lower than the first read error rate.

In some embodiments in which a third set of iterations is used, each of the third set of iterations includes reading values for the set of weights of the ANN to the MRAM using third read parameters corresponding to a third read error rate. The third read error rate is lower than the first read error rate and the second read error rate (e.g., the read error rate is gradually reduced as the training progresses).

In some implementations, the first read parameters include (536) a first read pulse duration and the second read parameters include a second read pulse duration that is longer than the first read pulse duration.

In some implementations, the first read parameters include (538) a first read current and the second read parameters include a second read current that is greater than the first read current.

The computing device stores (540) values for the trained ANN. The trained ANN is configured to classify second data (e.g., untrained data) based on the stored values.

In some implementations, after training the ANN, the computing device receives (542) second data and assigns scores to the second data using the stored values of the trained ANN.

In some implementations, an electronic system is provided. The system includes one or more processors, magnetic random access memory (MRAM), write circuitry configured to write data to the MRAM and a non-transitory computer-readable storage medium storing instructions for execution by the one or more processors. In some embodiments, the write circuitry includes word lines and bit lines (e.g., wires) and sets of corresponding transistors (e.g., for activating the word lines and bit lines). In some embodiments, the write circuitry includes or is coupled with memory storing the first write parameters and second write parameters. The stored instructions include instructions for receiving first data on which to train an artificial neural network (ANN). The instructions further include instructions for, using the MRAM, training the ANN by performing a first set of training iterations on the first data. Each of the first set of iterations includes writing, using the write circuitry, values for a set of weights of the ANN to the MRAM using first write parameters corresponding to a first write error rate. The instructions include instructions for, after performing the first set of iterations, performing a second set of training iterations on the first data. Each of the second set of iterations includes writing, using the write circuitry, values for the set of weights of the ANN to the MRAM using second write parameters corresponding to a second write error rate. The second write error rate is lower than the first write error rate. The instructions further include instructions for storing values for the trained ANN. The trained ANN is configured to classify second data based on the stored values.

In some implementations, the electronic system includes a chip (e.g., chip 202). In some embodiments, the MRAM resides on the chip. In some embodiments, the one or more processors reside on the chip. In some embodiments, the one or more processors comprise an arithmetic logic unit (ALU). In some embodiments, a non-transitory computer readable storage medium resides on the chip. In some embodiments, the non-transitory computer-readable storage medium is loaded (e.g., written) with the instructions when the chip is powered-up. In some embodiments, the non-transitory computer-readable storage medium comprises a portion of MRAM. In some embodiments, the electronic system includes an off-chip memory (e.g., DRAM, HBM) that holds some or all of the first data during the first set of training iterations and/or the second set of training iterations (e.g., the first data is bussed on and off the chip as needed during the first and second sets of iterations. Likewise, in some embodiments, after receiving the second data, the off-chip memory stores some or all of the second data (e.g., while the scores are being assigned to the second data). In some embodiments, an off-chip memory (e.g., a non-volatile memory) stores the instructions when the chip is powered off. In some embodiments, the chip includes a buffer that is communicatively coupled with the off-chip memory. In some embodiments, the buffer comprises a portion of the MRAM. In some embodiments, the buffer comprises a memory of type distinct from MRAM (e.g., SRAM).

In some implementations, the electronic system is configured to perform any of the operations described with reference to method 500.

Figure 6:
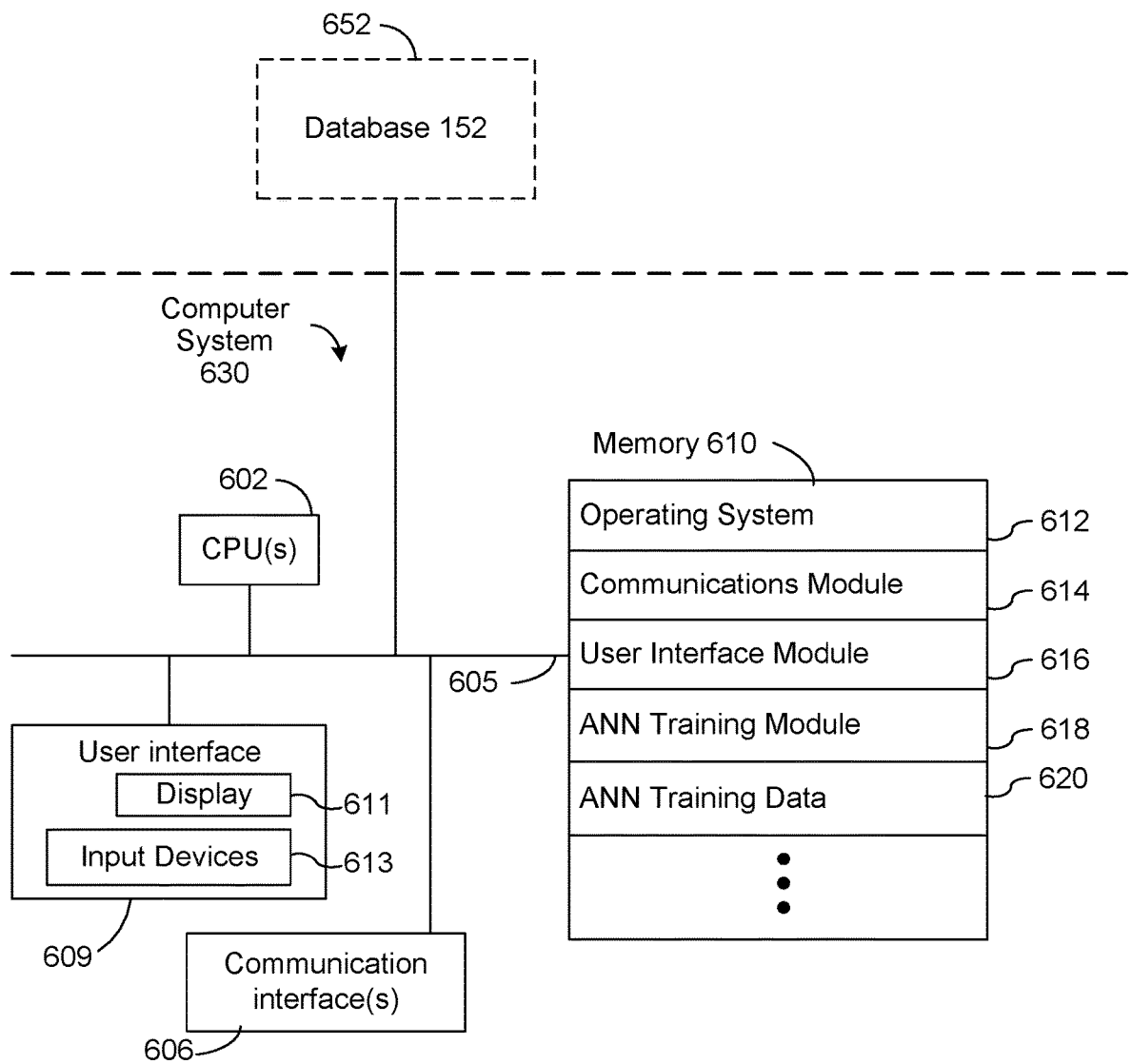
FIG. 6 is a block diagram of a computer system for training an artificial neural network, according to some embodiments.

FIG. 6 is a block diagram of a computer system 630 for training an artificial neural network, according to some embodiments. Computer system 630 typically includes one or more processors (sometimes called CPUs) 602 for executing programs or instructions; memory 610; one or more communications interfaces 606; and one or more communication buses 605 for interconnecting these components. In some embodiments, processors 602 include the chips 102/202 shown and described with reference to FIGS. 1-2. Computer system 630 optionally includes a user interface 609 comprising a display device 611 and one or more input devices 613 (e.g., one or more of a keyboard, mouse, touch screen, keypad, etc.) coupled to other components of computer system 630 by the one or more communication buses 605. The one or more communication buses 605 may include circuitry (sometimes called a chipset) that interconnects and controls communications between system components.

Communication interface 606 is used by computer system 630 to convey information to external systems, and to receive communications from external systems, such as external database 652 (e.g., which may store ANN training data or data to be classified by a trained ANN). The connection between computer system 630 and external database 652 may include a communication network such as the internet or a public or proprietary wireless network.

Memory 610 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 610 optionally includes one or more storage devices remotely located from the CPU(s) 602. Memory 610, or alternately the non-volatile memory device(s) within memory 610, comprises a computer readable storage medium. In some embodiments, memory 610 or the computer readable storage medium of memory 610 stores the following programs, modules and data structures, or a subset thereof:

- an operating system 612 that includes procedures for handling various basic system services and for performing hardware dependent tasks;
- a communications module 614 that operates in conjunction with communication interface 606 to handle communications between computer 130 and external systems;
- a user interface module 616 for receiving information from one or more input device 613 of user interface database 609, and to convey information to a user of computer system 630 via one or more display or output devices 611;

an ANN training module 618 for training an artificial neural network (e.g., causing the system to perform any of the ANN training methods described herein);

ANN training data 620 used for training artificial neural networks (e.g., sets of inputs and labels indicating correct classifications.

Operating system 612 and each of the above identified modules and applications correspond to a set of instructions for performing a function described above. The set of instructions can be executed by the one or more processors 602 of computer system 630. The above identified modules, applications or programs (i.e., sets of instructions) need not be implemented as separate software programs, procedures or modules, and thus various subsets of these modules may be combined or otherwise re-arranged in various embodiments. In some embodiments, memory 610 stores a subset of the modules and data structures identified above. Furthermore, memory 610 optionally stores additional modules and data structures not described above.

FIG. 6 is intended more as a functional description of the various features which may be present in a computer system 630 than as a structural schematic of the embodiments described herein. In practice, and as recognized by those of ordinary skill in the art, items shown separately could be combined and some items could be separated. For example, some items shown separately in FIG. 6 could be combined into a single module or component, and single items could be implemented using two or more modules or components. The actual number of modules and components, and how features are allocated among them will vary from one implementation to another.

In addition, in some embodiments, some or all of the above-described functions may be implemented with hardware circuits (e.g., field programmable gate arrays (FPGAs), application specific integrated circuits (ASICs), a "system on a chip" that includes processors and memory, or the like). To that end, in some embodiments, CPUs 602 include specialized hardware for performing these and other tasks.

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first electronic device could be termed a second electronic device, and, similarly, a second electronic device could be termed a first electronic device, without departing from the scope of the various described implementations. The first electronic device and the second electronic device are both electronic devices, but they are not the same type of electronic device.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method, comprising:

performing, at a computing device that includes one or more processors, magnetic random access memory (MRAM), and a non-transitory computer-readable storage medium storing instructions for execution by the one or more processors, a set of operations that includes:

receiving first data on which to train an artificial neural network (ANN);

using the MRAM, training the ANN by:

performing a first set of training iterations on the first data, wherein each of the first set of iterations includes writing values for a set of weights of the ANN to the MRAM using first write parameters corresponding to a first write error rate;

during the first set of training iterations, performing error detection that includes detecting an error in a respective weight stored in the MRAM;

replacing a value stored for the respective weight with a zero value prior to using the respective weight; and after performing the first set of iterations, performing a second set of training iterations on the first data, wherein each of the second set of iterations includes writing values for the set of weights of the ANN to the MRAM using second write parameters corresponding to a second write error rate, wherein the second write error rate is lower than the first write error rate;

storing values for the trained ANN, wherein the trained ANN is configured to classify second data based on the stored values.

2. The method of claim 1, wherein:

each of the first set of iterations includes writing values for a set of biases and a set of activations of the ANN; and each of the second set of iterations includes writing values for the set of biases and the set of activations of the ANN.

3. The method of claim 1, wherein:
the first write parameters include a first write pulse duration; and
the second write parameters include a second write pulse duration that is longer than the first write pulse duration.

4. The method of claim 1, wherein:
the first write parameters include a first write current; and
the second write parameters include a second write current that is greater than the first write current.

5. The method of claim 1, wherein:
writing the values for the set of weights of the ANN to the MRAM using the write parameters corresponding to the first write error rate includes writing the values without using an error-correcting code; and
writing the values for the set of weights of the ANN to the MRAM using the second write parameters corresponding to the second write error rate includes writing the values using an error-correcting code.

6. The method of claim 1, wherein:
each of the first set of training iterations includes:
reading the values for the set of weights of the ANN from the MRAM;
using the one or more processors, performing a set of arithmetic operations to update the values for the set of weights of the ANN,
wherein the values for the set of weights of the ANN written to the MRAM for the iteration are the updated set of weights.

7. The method of claim 6, wherein:
each of the second set of training iterations includes:
reading the values for the set of weights of the ANN from the MRAM;
using the one or more processors, performing the set of arithmetic operations to update the values for the set of weights of the ANN,
wherein the values for the set of weights of the ANN written to the MRAM for the iteration are the updated set of weights.

8. The method of claim 1, wherein the MRAM is on the same chip as the one or more processors.

9. The method of claim 1, wherein the first write parameters correspond to a bit error-rate below a threshold for convergence of the first set of training iterations.

10. The method of claim 9, wherein the threshold for convergence is greater than: $10^{-3}$, $10^{-5}$, or $10^{-7}$.

11. The method of claim 1, wherein the first write error rate is greater than: $10^{-4}$, $10^{-6}$, or $10^{-8}$.

12. The method of claim 1, wherein the first set of training iterations includes more than 20%, 40%, 60%, 80%, or 95% of a total number of training iterations used for training the ANN.

13. The method of claim 1, wherein:
each of the first set of iterations includes reading values for the set of weights of the ANN to the MRAM using first read parameters corresponding to a first read error rate; and
each of the second set of iterations includes reading values for the set of weights of the ANN to the MRAM using second read parameters corresponding to a second read error rate, wherein the second read error rate is lower than the first read error rate.

14. The method of claim 13, wherein:
the first read parameters include a first read pulse duration; and
the second read parameters include a second read pulse duration that is longer than the first read pulse duration.

15. The method of claim 1, wherein:
the first read parameters include a first read current; and
the second read parameters include a second read current that is greater than the first read current.

16. The method of claim 1, further comprising, after training the ANN:
receiving second data; and
assigning scores to the second data using the stored values of the trained ANN.

17. A system, comprising:
one or more processors;
magnetic random access memory (MRAM);
write circuitry configured to write data to the MRAM; and
a non-transitory computer-readable storage medium storing instructions for execution by the one or more processors, including instructions for:
receiving first data on which to train an artificial neural network (ANN);
using the MRAM, training the ANN by:
performing a first set of training iterations on the first data, wherein each of the first set of iterations includes writing, using the write circuitry, values for a set of weights of the ANN to the MRAM using first write parameters corresponding to a first write error rate; and
after performing the first set of iterations, performing a second set of training iterations on the first data, wherein each of the second set of iterations includes writing, using the write circuitry, values for the set of weights of the ANN to the MRAM using second write parameters corresponding to a second write error rate, wherein the second write error rate is lower than the first write error rate;
storing values for the trained ANN, wherein the trained ANN is configured to classify second data based on the stored values;
after training the ANN receiving second data, and assigning scores to the second data using the stored values of the trained ANN.

18. A method, comprising:
performing, at a computing device that includes one or more processors, magnetic random access memory (MRAM), and a non-transitory computer-readable storage medium storing instructions for execution by the one or more processors, a set of operations that includes:
receiving first data on which to train an artificial neural network (ANN);
using the MRAM, training the ANN by:
performing a first set of training iterations on the first data, wherein each of the first set of iterations includes writing values for a set of weights of the ANN to the MRAM using first write parameters corresponding to a first write error rate, wherein the first set of training iterations includes more than 20%, 40%, 60%, 80%, or 95% of a total number of training iterations used for training the ANN; and
after performing the first set of iterations, performing a second set of training iterations on the first data, wherein each of the second set of iterations includes writing values for the set of weights of the ANN to the MRAM using second write parameters corresponding to a second write error rate, wherein the second write error rate is lower than the first write error rate;

storing values for the trained ANN, wherein the trained ANN is configured to classify second data based on the stored values.

19. The method of claim 17, wherein:

each of the first set of iterations includes writing values for a set of biases and a set of activations of the ANN; and each of the second set of iterations includes writing values for the set of biases and the set of activations of the ANN.

20. The method of claim 17, wherein:

the first write parameters include a first write pulse duration; and the second write parameters include a second write pulse duration that is longer than the first write pulse duration.

* * * * *